US006163110A

United States Patent [19]

Arai

[11] Patent Number: 6,163,110

[45] Date of Patent: Dec. 19, 2000

[54] ORGANIC ELECTROLUMINESCENT DEVICE HAVING A PARTICULAR SUBSTRATE

[75] Inventor: Michio Arai, Tokyo, Japan

[73] Assignee: TDK Corporation, Tokyo, Japan

[21] Appl. No.: 09/140,535

[22] Filed: Aug. 26, 1998

[30] Foreign Application Priority Data

Aug. 27, 1997 [JP] Japan .................................... 9-246051

[51] Int. Cl.[7] ................................ H01J 1/62; H01J 63/04

[52] U.S. Cl. .......................... 313/503; 313/504; 313/506; 313/509

[58] Field of Search .................................... 313/503, 504, 313/506, 509

[56] References Cited

U.S. PATENT DOCUMENTS 5,258,690 11/1993 Leksell et al. .......................... 313/512

5,891,554 4/1999 Hosokawa et al. ..................... 428/212

FOREIGN PATENT DOCUMENTS 7-240277 9/1995 Japan .

*Primary Examiner*—Nimeshkumar D. Patel
*Assistant Examiner*—Karrabi Guharay
*Attorney, Agent, or Firm*—Oblon, Spivak, McClelland, Maier & Neustadt, P.C.

[57] ABSTRACT

An organic EL device comprises on a substrate an electron injecting electrode, a hole injecting electrode, and an organic layer located between both the electrodes. The substrate has an optical refractive index that is within±0.05 of that of the organic layer. By reducing losses due to a refractive index difference between the substrate and the organic layer, light emission luminance fluctuations can be reduced as much as possible even when there is a variation in the thickness of the organic layer.

3 Claims, No Drawings

ORGANIC ELECTROLUMINESCENT DEVICE HAVING A PARTICULAR SUBSTRATE

BACKGROUND OF THE INVENTION

The present invention relates generally to an organic EL (electroluminescent) device using an organic compound, and more specifically to an organic EL device less susceptible to light emission variations.

In recent years, organic EL devices have been under intensive investigation. One such device is basically built up of a thin film form of hole transporting material such as triphenyldiamine (TPD) deposited by evaporation on a hole injecting electrode, a light emitting layer of fluorescent material such as an aluminum quinolinol complex ($Alq^3$) laminated thereon, and a metal (electron injecting) electrode of a metal having a low work function such as Mg and formed on the light emitting layer. This organic EL device now attracts attentions because a very high luminance ranging from several hundreds to tens of thousands $cd/m^2$ can be achieved with a voltage of approximately 10 V.

As mentioned above, an organic EL device is basically made up of a substrate and an organic EL structure provided thereon, said organic EL structure comprising an electron injecting electrode, an organic layer or layers, a hole injecting electrode, etc. Usually, such an organic EL device is designed to take out the emitted light from a substrate side thereof.

When such organic EL devices are mass produced, there are often light emission luminance variations from device to device. For instance, a 20 nm variation in the thickness of the organic layer causes an approximately 20% fluctuation in light emission luminance. Such light emission luminance variations make it impossible to obtain desired results as designed, and to avoid them it is required to use additional equipment for luminance control, make the dimming range of a driving device or dimmer wider than needed, and regulate an end product made up of an organic EL device. These in turn incur increases in the cost of the product itself and labor incidental to the device such as preparation operations, and a drop of production efficiency.

If, in this case, the thickness of the organic layers is kept uniform, the light emission variations may then be controlled. However, it is very difficult, and unpractical, to make uniform the overall thickness of a multilayer structure comprising a plurality of different organic layers such as an electron injecting layer, an electron injecting and transporting layer, an electron transporting layer, a light emitting layer, a hole transporting layer, a hole injecting layer, and a hole injecting and transporting layer.

SUMMARY OF THE INVENTION

An object of the present invention is to provide organic EL devices less susceptible to light emission luminance variations from device to device.

As a result of making investigation of such light emission luminance variations from device to device, the inventors have found that a variation in the thickness of a film form of organic layer correlates with the light emission luminance variations. Then, the inventors have found that such a correlation stems from the facts that the refractive index of the organic layer is different from the refractive index of a substrate, and that with a variation in the thickness of the organic layer, there are transmittance and radiant efficiency fluctuations in the process in which the light emitted from the organic layer transmits through the organic layers and leaves the substrate.

The aforesaid object is achieved by the inventions defined below as (1) to (3).

(1) An organic electroluminescent device comprising on a substrate an electron injecting electrode, a hole injecting electrode, and an organic layer interleaved between both said electrodes, wherein:

said substrate has an optical refractive index that is within±0.05 of an optical refractive index of said organic layer.

(2) The organic electroluminescent device according to (1), wherein said substrate has an optical refractive index of 1.7±0.05.

(3) The organic electroluminescent device according to (1) or (2), wherein said substrate is a glass.

DETAILED DESCRIPTION OF THE INVENTION

Some illustrative embodiments of the invention will now be explained at great length.

The organic EL device of the invention comprises on a substrate, an electron injecting electrode, a hole injecting electrode, and an organic layer interleaved between both the electrodes. The optical refractive index of the substrate is within±0.05 of that of the organic layer. By bringing the optical refractive index of the substrate close to that of the organic layer, it is thus possible to increase an index-matching between the substrate and the organic layer, thereby making light emission luminance less variable even when there is a fluctuation in the thickness of the organic layer.

In the present invention, it is preferable that the refractive index of the substrate is within±0.05 of that of the organic layer, especially within 1.7±0.05, and more especially within 1.7±0.04, as measured at a wavelength or wavelengths of the maximal peak or peaks of light emission spectra in the wavelength range of 400 to 650 nm, for instance, at 520 nm wavelength. Usually, the organic layer has a refractive index of about 1.6 to 1.8 with an average approximate value of 1.7 being preferred. It is desired that the refractive index of the substrate, too, be as close to 1.7 as possible. By the refractive index of the organic layer used herein is intended refractive indices of all organic material-containing functional thin films in the organic EL device, which take part in light emission function, with the exception of an electron injecting layer, an electron injecting and transporting layer, an electron transporting layer, a light emitting layer, a hole transporting layer, a hole injecting layer, a hole injecting and transporting layer, an electron injecting electrode, and a hole injecting electrode. It is noted that the refractive indices of layers located beneath the organic layer, for instance, an electrode layer, a color filter layer, a color conversion layer (inclusive of a fluorescent filter layer, etc.), and a primer layer are foreclosed from the refractive index of the substrate used herein.

Preferably but not exclusively, the thickness of all organic layers is usually 0.2 $\mu$m or less, especially about 0.1 to 0.15 $\mu$m, and about 0.12 to 0.14 $\mu$n. The coefficient of variation of the thickness is preferably of the order of±30% with respect to the overall average thickness, especially±20%, and more especially±10%.

The substrate may be made up of a flat sheet form of material, for instance, a transparent or translucent material such as glass, quartz, and resin. However, preference is given to a glass material which has some strength, is easy to handle and obtain, and is inexpensive. It is more preferable to use lead oxide-containing glass materials such as lead-potassium glass, and lead-silicate glass because they are easily available and their refractive indices can be easily controlled. Such glass materials, for instance, include lead-potassium glass 8161 (made by Corning, and having a refractive index of 1.659 at 550 nm wavelength), and lead-silicate glass 8940 (made by Corning, and having a refractive index of 1.731 at 550 nm wavelength). In general, the more the content of lead, the higher the refractive index can be.

The thickness of the substrate is not critical to the practice of the invention; that is, it is usually 0.3 to 20 mm, and preferably 0.5 to 10 mm although it may be determined depending on the required strength and transparency, display size, the presence or absence of a filter, etc.

As already stated, an organic EL device has usually a structure comprising a film form of organic layer provided on a film form of hole injecting (transparent) electrode located on a substrate, so that the hole injecting electrode is interleaved between the organic layer and the substrate. Thus, the refractive index of the hole injecting electrode, too, offers a problem.

For the hole injecting electrode, it is usually preferable to use a transparent electrode because the organic EL device is designed to take out the emitted light from the substrate side thereof. Such a transparent electrode, for instance, include ITO (tin-doped indium oxide), IZO (zinc-doped indium oxide), ZnO, $SnO_2$, and $In_2O_3$, with ITO (tin-doped indium oxide), and IZO (zinc-doped indium oxide) being preferred. Referring to ITO, it is desired that the mixing ratio of $SnO_2$ with respect to $In_2O_3$ be in the range of 1 to 20 wt %, and especially 5 to 12 wt %. Referring to IZO, it is again desired that the mixing ratio of ZnO with respect to $In_2O_3$ be in the range of 1 to 20 wt %, and especially 5 to 12 wt %. Besides, ITO, and IZO may contain an oxide form of Sn, Ti, Pb, etc. in an amount of up to 1 wt % calculated as oxide.

The refractive index of such a transparent electrode is usually about 1.8 to 1.9 for ITO although varying with film-forming conditions, and film composition. It is thus preferred that the refractive index of the transparent (hole injecting) electrode, too, be close to 1.7. However, the refractive index of the transparent electrode may be neglected partly because it is difficult to regulate, and bring the refractive index of ITO or the like close to the aforesaid value, and partly because sufficient effects are achievable by the regulation of the refractive index of the substrate.

The coefficient of variation of light emission luminance of the organic EL device with the thus regulated refractive index is preferably within±20% of the whole average light emission luminance, more preferably within±10%, and most preferably within±5%.

Next, the organic EL structure forming part of the organic EL device according to the invention is explained. The organic EL structure of the invention comprises on a substrate a hole injecting electrode, an electron injecting electrode and at least one organic layer interleaved between both the electrodes. Each or the organic layer comprises at least one hole transporting layer and at least one light emitting layer, with an electron injecting electrode provided thereon. The organic layer may be provided with a protective electrode in the form of the uppermost layer. It is to be noted that the hole transporting layer may be dispenses with. The electron injecting electrode of a metal having a low work function or a compound or alloy thereof is provided by evaporation, sputtering and the like, preferably a sputtering process.

The aforesaid hole injecting electrode may be formed as by evaporation, but should preferably be formed by a sputtering technique. When a sputtering process is applied to the formation of an ITO or IZO electrode, it is preferable to use a target comprising $In_2O_3$ doped with $SnO_2$ or ZnO. An ITO transparent electrode, when formed by the sputtering technique, suffers a lesser light emission luminance change with time, as compared with an electrode formed by evaporation. For the sputtering technique, it is preferable to use DC sputtering. Power input is then preferably in the range of 0.1 to 4 $W/cm^2$. Power input for a DC sputtering system in particular is preferably in the range of 0.1 to 10 $W/cm^2$, and especially 0.2 to 5 $W/cm^2$. The film forming rate is preferably in the range of 2 to 100 nm/min., and especially 5 to 50 nm/min.

Preferably but no exclusively, an inert gas such as Ar, He, Ne, Kr, and Xe or a mixture of such inert gases is used as the sputtering gas. The sputtering pressure of such gases may usually be of the order of 0.1 to 20 Pa.

The hole injecting electrode may have at least a certain thickness enough for hole injection; that is, it may have a thickness of usually 5 to 500 nm, and especially 10 to 300 nm.

For the material that forms a film form of electron injecting electrode, it is preferable to use a material effective for injection of electrons and having a low work function, e.g., any one of metal elements K, Li, Na, Mg, La, Ce, Ca, Sr, Ba, Al, Ag, In, Sn, Zn, Zr, Cs, Er, Eu, Ga, Hf, Nd, Rb, Sc, Sm, Ta, Y, and Yb, or compounds such as BaO, BaS, CaO, HfC, $LbB_6$, MgO, MoC, NbC, PbS, SrO, TaC, ThC, $ThO_2$, ThS, TiC, TiN, UC, UN, $UO_2$, $W_2C$, $Y_2O_3$, ZrC, ZrN, and $ZrO_2$. To improve the stability of the electrode, it is also preferable to use binary or ternary alloy systems containing metal elements. Preferred alloy systems, for instance, are aluminum alloy systems such as Al·Ca (Ca: 5 to 20 at %), Al·In (In: 1 to 10 at %), Al·Li (0.1 at %$<$Li$<$20 at %), and Al·R where R stands for a rare earth element including Y, and Sc, and In·Mg systems (Mg: 50 to 80 at %). Particular preference is given to pure Al, and aluminum alloy systems such as Al·Li (0.4 at %$\leqq$Li$<$6.5 at % or 6.5 at %$\leqq$Li$\leqq$14 at %), and Al·R (R: 0.1 to 25 at %, especially 0.5 to 20 at %) because they are unlikely to produce compression stress. Thus, such electron injecting electrode-forming metals or alloys are usually employed as sputtering targets. These metals or alloys have a work function of 4.5 eV or lower. In the practice of the invention, it is particularly preferable to use metals or alloys having a work function of 4.0 eV or lower.

In the electron injecting electrode film formed by the sputtering technique, the atoms or atom groups upon sputtering have a kinetic energy relatively higher than would be obtained with the evaporation technique, so that the adhesion of the electron injecting electrode film to the organic layer at their interface is improved due to a surface migration effect. In addition, an oxide layer is removed in vacuum from the surface of the electrode by pre-sputtering or moisture or oxygen is removed from the organic layer interface, on which they are absorbed, by reverse sputtering to form a clean electrode-organic layer interface or a clean electrode, so that consistent organic EL devices of high quality can be produced. For the target, the alloys having the aforesaid composition range, and pure metals may be used alone or in combination with an additional target comprising a subordinate component or components or with the addition of a subordinate component or components thereto. It is also acceptable to use a mixture of materials having largely varying vapor pressures as the target, because there is only slight a deviation of the composition of the resultant film from the target composition. There is thus no limitation on the material used with the sputtering technique, whereas there are some limitations such as vapor pressure on the evaporation technique. The sputtering technique is additionally advantageous over the evaporation technique in terms of consistent film thickness and quality as well as productivity, because it is unnecessary to feed the raw material over an extended period of time.

The electron injecting electrode formed by the sputtering technique is a film so very dense that the penetration of moisture into the film is much more reduced as compared with a coarse film prepared by evaporation, and so the chemical stability of the film is much more increased. This ensures the production of organic EL devices having an ever longer service life.

Preferably, the sputtering gas pressure during sputtering is in the range of 0.1 to 5 Pa. By regulating the sputtering gas pressure within this range, it is possible to easily obtain an AlLi alloy having an Li concentration in the aforesaid range. By altering the sputtering gas pressure in the aforesaid range during film formation, it is also possible to easily obtain an electron injecting electrode having such an Li concentration gradient as defined above. It is also preferable to meet a particular condition that the product of the film forming gas pressure and the substrate-to-target distance must be 20 to 65 Pa·cm.

For the sputtering gas, use is made of inert gases employed with ordinary sputtering systems. For reactive sputtering, reactive gases such as $N_2$, $H_2$, $O_2$, $C_2H_4$, and $NH_3$ may be used in addition to these gases.

In the practice of the invention, it is possible to use an RF sputtering process using an RF power source or the like as the sputtering technique. In view of the ease with which the film forming rate is controlled, and less damage to an organic EL device structure, however, it is preferable to use a DC sputtering process. Power for operating a CD sputtering system is in the range of preferably 0.1 to 10 W/cm$^2$, and especially 0.5 to 7 W/cm$^2$. The film forming rate is preferably in the range of 5 to 100 nm/min., and especially 10 to 50 nm/min.

The thin film form of electron injecting electrode may have at least a certain thickness enough for the injection of electrons, e.g., of at least 1 nm, and preferably at least 3 nm. Thus, a film thickness of the order of 3 to 500 nm is usually preferable although there is no upper limit thereon.

The organic EL device of the invention may preferably have a protective electrode on the electron injecting electrode, i.e., on the side of the electron injecting electrode that faces away from the organic layer. By the provision of the protective electrode, the electron injecting electrode is protected against the air, moisture, etc., so that the degradation of the constituting thin film can be prevented, resulting in the stabilization of electron injection efficiency and an ever greater increase in the service life of the device. The protective electrode has a very low resistance, and so may also function as an interconnecting electrode when the electron injecting electrode has a high resistance. The protective electrode may contain at least one of Al; Al and a transition metal except Ti; Ti; and titanium nitride (TiN). When these are used alone, the protective electrode preferably contains Al in an amount of about 90 to 100 at %, Ti in an amount of about 90 to 100 at %, and TiN in an amount of about 90 to 100 mol %. Two or more of Al, Ti and TiN may be used at any desired mixing ratio. For instance, a mixture of Al and Ti preferably contains Ti in an amount of up to 10 at %. Alternatively, it is acceptable to laminate together laminae each containing a single species. In particular, favorable results are obtained when Al or Al plus transition metal are used as the interconnecting electrode to be described later. TiN, on the other hand, provides a film having a striking sealing effect because of its good corrosion resistance. For TiN, an about 10% deviation from its stoichiometric composition is acceptable. In addition, Al alloys, and transition metal alloys may contain transition metals, especially Sc, Nb, Zr, Hf, Nd, Ta, Cu, Si, Cr, Mo, Mn, Ni, Pd, Pt and W in the total amount of up to 10 at %, especially up to 5 at %, and more especially up to 2 at %. When the protective electrode functions as the interconnecting material, the thin film resistance becomes lower with a decrease in the content of the transition metal.

The protective electrode may have at least a certain thickness enough to make sure of electron injection efficiency and prevent penetration of moisture, oxygen or organic solvents, for instance, of at least 50 nm, preferably at least 100 nm, and especially 100 to 1,000 nm. With too thin a protective electrode layer, neither are the advantages of the invention obtainable, nor is sufficient connection with terminal electrodes obtainable because the ability of the protective electrode layer to cover steps becomes low. When the protective electrode layer is too thick, on the other hand, the growth rate of dark spots becomes high because of an increase in the stress of the protective electrode layer. It is here to be noted that when the protective electrode functions as an interconnecting electrode, its thickness may be usually of the order of 100 to 500 nm so as to make up for the high film resistance of the electron injecting electrode due to its thinness, and that when the protective electrode functions as other interconnecting electrode, its thickness may be of the order of 100 to 300 nm.

Preferably but not exclusively, the total thickness of the electron injecting electrode plus the protective electrode is usually of the order of 100 to 1,000 nm.

In addition to the aforesaid protective electrode, an additional protective film may be formed after the formation of the electrode. The protective film may be formed of either an inorganic material such as SiOx or an organic material such as Teflon, and a chlorine-containing carbon fluoride polymer. The protective film may be either transparent or opaque, and has a thickness of the order of 50 to 1,200 nm. The protective film may be formed either by the aforesaid reactive sputtering process or conventional processes such as general sputtering, evaporation or PECVD.

In the practice of the invention, it is preferred to form a sealing layer on the device in order to prevent oxidation of the organic layers and electrodes. The sealing layer for preventing penetration of moisture may be formed by bonding sealing plates such as glass plates with adhesive resin layers of low hygroscopicity such as commercially available sheets of photo-curable adhesives, epoxy adhesives, silicone adhesives, and crosslinking ethylene-vinyl acetate copolymer adhesives. Instead of the glass plates, metal or plastic plates may also be used.

Next, the organic material layers provided in the organic EL device of the invention are explained.

The light emitting layer has functions of injecting holes and electrons, transporting them, and recombining holes and electrons to create excitons. For the light emitting layer, it is preferable to use a relatively electronically neutral compound.

The hole injecting and transporting layer has functions of facilitating injection of holes from the hole injecting electrode, providing stable transportation of holes and blocking electrons, and the electron injecting and transporting layer has functions of facilitating injection of electrons from the cathode, providing stable transportation of electrons and blocking holes. These layers are effective for increasing the number of holes and electrons injected into the light emitting layer and confining holes and electrons therein for optimizing the recombination region to improve light emission efficiency.

The thickness of the light emitting layer, the hole injecting and transporting layer, and the electron injecting and transporting layer is not critical and varies with a particular formation technique although it is usually of the order of preferably 5 to 500 nm, and especially 10 to 300 nm.

The thickness of the hole injecting and transporting layers, and the electron injecting and transporting layer is equal to, or about 1/10 times to about 10 times as large as the thickness of the light emitting layer although it depends on the design of the recombination/light emitting region. When the electron or hole injecting and transporting layer is separated into an injecting layer and a transporting layer, it is preferable that the injecting layer is at least 1 nm thick and the transporting layer is at least 1 nm thick. The upper limit on thickness is usually about 500 nm for the injecting layer and about 500 nm for the transporting layer. The same film thickness applies when two injecting and transporting layers are provided.

In the organic EL device according to the invention, the light emitting layer contains a fluorescent material that is a compound capable of emitting light. The fluorescent material used herein, for instance, may be at least one compound selected from compounds such as those disclosed in JP-A 63-264692, e.g., quinacridone, rubrene, and styryl dyes. Use may also be made of quinoline derivatives such as metal complex dyes containing 8-quinolinol or its derivative as ligands, for instance, tris(8-quinolinolato)aluminum, tetraphenylbutadiene, anthracene, perylene, coronene, and 12-phthaloperinone derivatives. Use may further be made of phenylanthracene derivatives disclosed in Japanese Patent Application No. 6-110569, and tetraarylethene derivatives disclosed in Japanese Patent Application 6-114456.

Preferably, the fluorescent compound is used in combination with a host substance capable of emitting light by itself; that is, it is preferable that the fluorescent compound is used as a dopant. In such a case, the content of the fluorescent compound in the light emitting layer is in the range of preferably 0.01 to 10% by weight, and especially 0.1 to 5% by weight. By using the fluorescent compound in combination with the host substance, it is possible to vary the wavelength performance of light emission, thereby making light emission possible on a longer wavelength side and, hence, improving the light emission efficiency and stability of the device.

Quinolinolato complexes, and aluminum complexes containing 8-quinolinol or its derivatives as ligands are preferred for the host substance. Such aluminum complexes are typically disclosed in JP-Al's 63-264692, 3-255190, 5-70733, 5-258859, 6-215874, etc.

Exemplary aluminum complexes include tris(8-quinolinolato)aluminum, bis(8-quinolinolato)magnesium, bis(benzo{f}-8-quinolinolato)zinc, bis(2-methyl-8-quinolinolato)aluminum oxide, tris(8-quinolinolato)indium, tris(5-methyl-8-quinolinolato)aluminum, 8-quinolinolatolithium, tris(5-chloro-8-quinolinolato) gallium, bis(5-chloro8-quinolinolato)calcium, 5,7-dichloro-8-quinolinolatoaluminum, tris(5,7-dibromo-8-hydroxyquinolinolato)aluminum, and poly[zinc(II)-bis(8-hydroxy-5-quinolinyl)methane].

Use may also be made of aluminum complexes containing other ligands in addition to 8-quinolinol or its derivatives, for instance, bis(2-methyl-8-quinolinolato)(phenolato) aluminum (III), bis(2-methyl-8-quinolinolato)(o-cresolato) aluminum (III), bis(2-methyl-8-quinolinolato)(m-cresolato) aluminum (III), bis(2-methyl-8-quinolinolato)(p-cresolato) aluminum (III), bis(2-methyl-8-quinolinolato)(o-phenylphenolato)aluminum (III), bis(2-methyl-8-quinolinolato)(mphenylphenolato)aluminum (III), bis(2-methyl-8-quinolinolato) (p-phenylphenolato)aluminum (III), bis(2-methyl-8-quinolinolato)(2,3-dimethylphenolato) aluminum (III), bis(2-methyl-8-quinolinolato)(2,6-dimethylphenolato)aluminum (III), bis(2-methyl-8-quinolinolato)(3,4-dimethylphenolato)aluminum (III), bis (2-methyl-8-quinolinolato)(3,5-dimethyl-phenolato) aluminum (III), bis(2-methyl-8-quinolinolato)(3,5-di-tertbutylphenolato)aluminum (III), bis(2-methyl-8-quinolinolato)(2,6-diphenylphenolato)aluminum (III), bis (2-methyl-8-quinolinolato)(2,4,6-triphenylphenolato) aluminum (III), bis(2-methyl-8-quinolinolato)(2,3,6-trimethylphenolato)aluminum (III), bis(2-methyl-8-quinolinolato) (2,3,5,6-tetramethylphenolato)aluminum (III), bis(2-methyl-8-quinolinolato)(1-naphtholato) aluminum (III), bis(2-methyl-8-quinolinolato)(2-naphtholato)aluminum (III), bis(2,4-dimethyl-8-quinolinolato)(o-phenylphenolato)aluminum (III), bis(2,4-dimethyl-8-quinolinolato)(p-phenylphenolato)aluminum (III), bis(2,4-dimethyl-8-quinolinolato)(m-phenylphenolato) aluminum (III), bis(2,4-dimethyl-8-quinolinolato)(3,5-dimethylphenolato)aluminum (III), bis (2,4-dimethyl-8-quinolinolato)(3,5-di-tert-butylphenolato) aluminum (III), bis(2-methyl-4-ethyl-8-quinolinolato)(p-cresolato)aluminum (III), bis(2-methyl-4-methoxy-8-quinolinolato)(p-phenylphenolato)aluminum (III), bis(2-methyl-5-cyano-8-quinolinolato)(o-cresolato)aluminum (III), and bis(2-methyl-trifluoromethyl-8-quinolinolato)(2-naphtholato)aluminum (III).

Besides, use may be made of bis(2-methyl-8-quinolinolato)aluminum (III)-$\mu$-oxo-bis(2-methyl-8-quinolinolato) aluminum (III), bis(2,4-dimethyl-8-quinolinolato)aluminum (III)-$\mu$-oxo-bis(2,4-dimethyl-8-quinolinolato)aluminum (III), bis(4-ethyl-2-methyl-8-quinolinolato)aluminum (III)-$\mu$-oxo-bis(4-ethyl-2-methyl-8-quinolinolato)aluminum (III), bis(2-methyl-4-methoxyquinolinolato)aluminum (III)-$\mu$-oxo-bis(2-methyl-4-methoxyquinolinolato)aluminum (III), bis(5-cyano-2-methyl-8-quinolinolato)aluminum (III)-$\mu$-oxo-bis(5-cyano-2-methyl-8-quinolinolato)aluminum (III), bis(2-methyl-5-trifluoromethyl-8-quinolinolato)aluminum (III)-$\mu$-oxo-bis (2-methyl-5-trifluoromethyl-8-quinolinolato)aluminum (III), etc.

Other preferable host substances include phenylanthracene derivatives disclosed in Japanese Patent Application No. 6-110569, tetraarylethene derivatives disclosed in Japanese Patent Application No. 6-114456, etc.

In the practice of the invention, the light emitting layer may also serve as an electron injecting and transporting layer. In this case, it is preferable to use a fluorescent material, e.g., tris(8-quinolinolato)aluminum or the like, which may be provided by evaporation.

If necessary or preferably, the light emitting layer is formed of a mixed layer of at least one compound capable of injecting and transporting holes with at least one compound capable of injecting and transporting electrons. Preferably in this case, a dopant is incorporated in the mixed layer The content of the dopant compound in the mixed layer is in the range of preferably 0.01 to 20% by weight, and especially 0.1 to 15% by weight.

In the mixed layer with a hopping conduction path available for carriers, each carrier migrates in the polarly prevailing substance, so making the injection of carriers having an opposite polarity unlikely to occur. This leads to an increase in the service life of the device due to less damage to the organic compound. By incorporating the aforesaid dopant in such a mixed layer, it is possible to vary the wavelength performance of light emission that the mixed layer itself possesses, thereby shifting the wavelength of light emission to a longer wavelength side and improving the intensity of light emission, and the stability of the device as well.

The compound capable of injecting and transporting holes and the compound capable of injecting and transporting electrons, both used to form the mixed layer, may be selected from compounds for the injection and transportation of holes and compounds for the injection and transportation of electrons, as will be described later. Especially for the compounds for the injection and transportation of holes, it is preferable to use amine derivatives having strong fluorescence, for instance, hole transporting materials such as triphenyldiamine derivatives, styrylamine derivatives, and amine derivatives having an aromatic fused ring.

For the compounds capable of injecting and transporting electrons, it is preferable to use metal complexes containing quinoline derivatives, especially 8-quinolinol or its derivatives as ligands, in particular, tris(8-quinolinolato) aluminum ($Alq^3$). It is also preferable to use the aforesaid phenylanthracene derivatives, and tetraarylethene derivatives.

For the compounds for the injection and transportation of holes, it is preferable to use amine derivatives having strong fluorescence, for instance, hole transporting materials such as triphenyldiamine derivatives, styrylamine derivatives, and amine derivatives having an aromatic fused ring.

In this case, the ratio of mixing the compound capable of injecting and transporting holes with the compound capable of injecting and transporting electrons is determined while the carrier mobility and carrier density are taken into consideration. In general, however, it is preferred that the weight ratio between the compound capable of injecting and transporting holes and the compound capable of injecting and transporting electrons is of the order of 1/99 to 99/1, particularly 10/90 to 90/10, and more particularly 20/80 to 80/20.

The thickness of the mixed layer must correspond to the thickness of a single molecular layer, and so is preferably less than the thickness of the organic compound layer. More specifically, the mixed layer has a thickness of preferably 1 to 85 nm, especially 5 to 60 nm, and more especially 5 to 50 nm.

Preferably, the mixed layer is formed by co-evaporation where the selected compounds are evaporated from different evaporation sources. When the compounds to be mixed have identical or slightly different vapor pressures (evaporation temperatures), however, they may have previously been mixed together in the same evaporation boat for the subsequent evaporation. Preferably, the compounds are uniformly mixed together in the mixed layer. However, the compounds in an archipelagic form may be present in the mixed layer. The light emitting layer may generally be formed at a given thickness by the evaporation of the organic fluorescent substance or coating a dispersion of the organic fluorescent substance in a resin binder.

For the hole injecting and transporting layer, use may be made of various organic compounds as disclosed in JP-A's 63-295695, 2-191694, 3-792, 5-234681, 5-239455, 5-299174, 7-126225, 7-126226 and 8-100172 and EP 0650955A1. Examples are tetraarylbenzidine compounds (triaryldiamine or triphenyldiamine (TPD)), aromatic tertiary amines, hydrazone derivatives, carbazole derivatives, triazole derivatives, imidazole derivatives, oxadiazole derivatives having an amino group, and polythiophenes. Where these compounds are used in combination of two or more, they may be stacked as separate layers, or otherwise mixed.

When the hole injecting and transporting layer is provided as a separate hole injecting layer and a separate hole transporting layer, two or more compounds are selected in a preferable combination from the compounds already mentioned for the hole injecting and transporting layer. In this regard, it is preferred to laminate layers in such an order that a compound layer having a lower ionization potential is disposed nearest to the hole injecting electrode (ITO, etc.). It is also preferred to use a compound having good thin film forming ability at the anode surface. This order of lamination holds for the provision of two or more hole injecting and transporting layers, and is effective as well for lowering driving voltage and preventing the occurrence of current leakage and the appearance and growth of dark spots. Since evaporation is utilized in the manufacture of devices, films as thin as about 1 to 10 nm can be formed in a uniform and pinhole-free state, which restrains any change in color tone of light emission and a drop of efficiency by re-absorption even if a compound having a low ionization potential and absorption in the visible range is used in the hole injecting layer. Like the light emitting layer and so on, the hole injecting and transporting layer or layers may be formed by evaporating the aforesaid compounds.

For the electron injecting and transporting layer which is provided if necessary, there may be used quinoline derivatives such as organic metal complexes containing 8-quinolinol or its derivatives as ligands, for instance, tris (8-quinolinolato)aluminum ($Alq^3$), oxadiazole derivatives, perylene derivatives, pyridine derivatives, pyrimidine derivatives, quinoxaline derivative, diphenylquinone derivatives, and nitro-substituted fluorene derivatives. The electron injecting and transporting layer may also serve as a light emitting layer. In this case, it is preferable to use tris(8-quinolilato)aluminum, etc. As is the case with the light emitting layer, the electron injecting and transporting layer may then be formed by evaporation or the like.

Where the electron injecting and transporting layer is a double-layered structure comprising an electron injecting layer and an electron transporting layer, two or more compounds are selected in a preferably combination from the compounds commonly used for electron injecting and transporting layers. In this regard, it is preferred to laminate layers in such an order that a compound layer having a greater electron affinity is disposed nearest to the electron injecting electrode. This order of lamination also applies where a plurality of electron injecting and transporting layers are provided.

The substrate may be provided with a color filter film, fluorescent material-containing color conversion film or dielectric reflecting film for controlling the color of light emission.

For the color filter film, a color filter employed with liquid crystal display devices may be used. However, it is preferable to control the properties of the color filter in conformity to the light emitted from the organic EL device, thereby optimizing the efficiency of taking out light emission and color purity.

By using a color filter capable of cutting off extraneous light of such short wavelength as absorbed by the EL device material or the fluorescent conversion layer, it is possible to improve the light resistance of the device and the contrast of what is displayed on the device.

Instead of the color filter, an optical thin film such as a dielectric multilayer film may be used.

The fluorescent color conversion film absorbs light emitted from an EL device and gives out light from the phosphors contained therein for the color conversion of light emission, and is composed of three components, a binder, a fluorescent material and a light absorbing material.

In the practice of the invention, it is basically preferable to use a fluorescent material having high fluorescent quantum efficiency, and especially a fluorescent material having strong absorption in an EL light emission wavelength region. Laser dyes are suitable for the practice of the invention. To this end, for instance, it is preferable to use rohodamine compounds, perylene compounds, cyanine compounds, phthalocyanine compounds (including subphthalocyanine compounds, etc.), naphthaloimide compounds, fused cyclic hydrocarbon compounds, fused heterocyclic compounds, styryl compounds, and coumarin compounds.

For the binder, it is basically preferable to make an appropriate selection from materials that do not extinguish fluorescence. It is particularly preferable to use a material that can be finely patterned by photolithography, printing or the like. It is also preferable to use a material that is not damaged during ITO or IZO film formation.

The light absorbing material is used when light is not fully absorbed by the fluorescent material, and so may be dispensed with, if not required. For the light absorbing material, it is preferable to make a selection from materials that do not extinguish fluorescence.

To form the hole injecting and transporting layer, the light emitting layer and the electron injecting and transporting layer, it is preferable to use a vacuum evaporation technique which enables a homogeneous thin film to be obtained. According to the vacuum evaporation process, it is possible to obtain homogeneous thin films in an amorphous state or with a crystal grain diameter of at most 0.1 $\mu$m. The use of a thin film having a crystal grain diameter exceeding 0.1 $\mu$n results in non-uniform light emission. To avoid this, it is required to increase the driving voltage of the device; however, there is a striking drop of charge injection efficiency.

No particular limitation is imposed on vacuum evaporation conditions. However, an evaporation rate of the order of 0.01 to 1 nm/sec. is preferably applied at a degree of vacuum of $10^{-4}$ Pa or lower. It is also preferable to form the layers continuously in vacuum. If the layers are continuously formed in vacuum, high properties are then obtained because the adsorption of impurities on the interface between the adjacent layers can be avoided. Furthermore, the driving voltage of the device can be lowered while the growth and occurrence of dark spots are inhibited.

When the vacuum evaporation process is used to form the layers, each containing a plurality of compounds, it is preferable to carry out co-evaporation while boats charged with the compounds are individually placed under temperature control.

The organic EL device of the invention is generally of the DC drive type while it may be of the AC or pulse drive type. The applied voltage is generally of the order of 2 to 20 volts.

EXAMPLE

The present invention are explained more specifically with reference to some illustrative examples.

Example 1

Lead-silicate glass 8940 (Corning) was used for a glass substrate. The glass substrate had a thickness of 0.7 mm and a refractive index of 1.731 at 550 nm wavelength. The glass substrate was provided thereon with an 85 nm-thick ITO transparent electrode (hole injecting electrode), and pixels (280×280 $\mu$m per pixel) were patterned on the ITO transparent electrode according to an array of 64 dots×7 lines. Then, the substrate with the patterned hole injecting electrode formed on it was ultrasonically washed with neutral detergent, acetone, and ethanol, and then pulled up from boiling ethanol, followed by drying. The substrate was subsequently cleaned on its surface with $UV/O_3$.

Then, the substrate was passed into a film forming chamber and fixed to a substrate holder in a vacuum evaporation system, which was evacuated to a vacuum of $1\times10^{31\ 4}$ Pa or lower. 4,4',4"-tris(-N-methylphenyl)-N-phenylamino) triphenylamine (m-MTDATA) was deposited by evaporation at a deposition rate of 0.2 nm/sec. to a thickness of 40 nm, thereby forming a hole injecting layer. With the vacuum still maintained, N,N'-diphenyl-N,N'-m-tolyl-4,4'-diamino-1,1'-biphenyl (TPD) was then deposited by evaporation at a deposition rate of 0.2 nm/sec. to a thickness of 35 nm, thereby forming a hole transporting layer. With the vacuum still kept, tris(8-quinolinolato)aluminum ($Alq^3$) was deposited by evaporation at a deposition rate of 0.2 nm/sec. to a thickness of 50 nm, thereby forming a combined electron injecting/transporting and light emitting layer. The total thickness of these organic layers was 130 nm. With the vacuum still kept, MgAg was deposited by co-evaporation at an evaporation rate ratio of Mg:Ag=10 to a thickness of 200 nm, thereby forming an electron injecting layer. With the vacuum still maintained, this EL device substrate was transferred to a sputtering system where an Al protective film of 200 nm in thickness was formed at a sputtering pressure of 0.3 Pa by means of a DC sputtering process using an Al target. Ar was used for the sputtering gas, with a power input of 500 W, a target diameter of 4 inches, and a substrate-target distance of 90 mm. Finally, a glass material was bonded and sealed on the protective film using a bonding agent and a spacer of given size.

By measurement, the organic layers of the obtained sample was found to have a refractive index of 1.71 at 520 nm wavelength. Likewise, the ITO transparent electrode layer was found to have a refractive index of 1.82.

In the air atmosphere, a DC voltage was applied on 20 organic EL device samples obtained as mentioned above to drive them at a constant current density of 10 $mA/cm^2$. Average light emission luminance was found from the light emission luminance measurements, and the coefficient of variation of each sample with respect to the average value of light emission luminance was determined. These organic EL devices were found to have a light emission maximum wavelength of 520 nm.

Consequently, excellent results were obtained; the coefficients of variation of all samples were within±5% with respect to the average light emission luminance of 350 $cd/m^2$.

Comparative Example 1

Samples were prepared and estimated as in Example 1 with the exception that the glass substrate was changed to Glass 7059 (Corning) having a refractive index of 1.53 at 520 nm wavelength and a thickness of 0.7 mm.

Consequently, it was ascertained that the coefficient of variation of light emission luminance is extremely increased; the coefficient of variation of each sample is within a wide range of±25% with respect to the average light emission luminance of 345 cd/$m^2$.

According to the present invention, it is thus possible to provide organic EL devices with a reduced variation in light emission luminance from device to device.

Japanese Patent Application No. 246051/1997 is herein incorporated by reference.

While the invention has been described with reference to preferred embodiments, it will be obvious to those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed as the best mode contemplated for carrying out the invention, but that the invention will include all embodiments falling within the scope of the appended claims.

What is claimed is:

1. An organic electroluminescent device comprising, on a substrate, an electron injecting electrode, a hole injecting electrode, and an organic layer interleaved between both said electrodes, wherein said substrate has an optical refractive index that is within±0.05 of an optical refractive index of said organic layer, said substrate has an optical refractive index of 1.7±0.05, and said substrate comprises a material selected from the group consisting of a lead-potassium glass and a lead-silicate glass.

2. The organic electroluminescent device according to claim 1, wherein said substrate is a glass.

3. A method of making an organic electroluminescent device, the method comprising depositing, on a substrate, an electron injecting electrode, a hole injecting electrode, and an organic layer interleaved between both said electrodes; and forming the organic electroluminescent device of claim 1.

* * * * *